United States Patent
Ishizaki

(10) Patent No.: US 7,332,364 B2
(45) Date of Patent: Feb. 19, 2008

(54) METHOD OF FABRICATING A ZN-BASE SEMICONDUCTOR LIGHT EMITTING DEVICE

(75) Inventor: Jun-ya Ishizaki, Annaka (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 11/475,016

(22) Filed: Jun. 27, 2006

(65) Prior Publication Data

US 2006/0246618 A1    Nov. 2, 2006

Related U.S. Application Data

(62) Division of application No. 10/496,667, filed as application No. PCT/JP02/11426 on Nov. 1, 2002, now abandoned.

(30) Foreign Application Priority Data

Nov. 30, 2001  (JP)  ............................. 2001-365557

(51) Int. Cl.
*H01L 21/00* (2006.01)
*H01L 29/221* (2006.01)
(52) U.S. Cl. ........................... 438/22; 257/96
(58) Field of Classification Search ................ 438/22
See application file for complete search history.

(56) References Cited

U.S. PATENT DOCUMENTS 6,342,313 B1 * 1/2002 White et al. ................ 428/701
6,407,405 B1 * 6/2002 Sano et al. ................... 257/15
6,791,257 B1 * 9/2004 Sato et al. ................... 313/498

FOREIGN PATENT DOCUMENTS

JP    8-148719    6/1996
JP    10-270799    10/1998

OTHER PUBLICATIONS

Sher, A. et al., "Fabrication of n-Native Oxide/p-ZnTe Heterojunctions by the Anodic Oxidation of ZnTe MBE Layers," *Journal of Electronic Materials*, 1992, pp. 653-657, vol. 21, No. 6.
Caneau, C. et al., "Elaboration and Metallurgical Characterization of ZnTe: O Crystals," *Journal of Crystal Growth*, 1981, pp. 605-610.

(Continued)

*Primary Examiner*—Kiesha L. Rose
(74) *Attorney, Agent, or Firm*—Snider & Associates; Ronald R. Snider

(57) ABSTRACT

A p-n junction interface 3 is formed between an n-type $ZnTe_{1-x}O_x$ ($0.5 \leq x \leq 1$) layer 8 and a p-type $ZnTe_{1-x}O_x$ ($0 \leq x < 0.5$) layer 7, and the n-type ZnTeO layer 8 and/or p-type ZnTeO layer 7 are formed by thermal oxidation of the main surficial side of a p-type ZnTe wafer. This is successful in providing a Zn-base semiconductor light emitting device and a method of fabricating thereof possibly be improved in the emission efficiency at a light emitting layer composed of a Zn-base semiconductor light emitting device.

2 Claims, 4 Drawing Sheets

OTHER PUBLICATIONS

Ebina, A. et al., "Oxidation properties of II-VI compound surfaces studied by low-energy electron-loss spectroscopy and 21 eV photoemission spectroscopy," *Journal of Vacuum Science & Technology*, Sep./Oct. 1980, pp. 1074-1079, vol. 17, No. 5.

Kajita, D. et al., "Growth and Characterization of MBE ZnTeO Thin Films," *Extended Abstracts (The 48th Spring Meeting, 2001; The Japan Society of Applied Physics and Related Societies*, Mar. 28, 2001, p. 330.

* cited by examiner

METHOD OF FABRICATING A ZN-BASE SEMICONDUCTOR LIGHT EMITTING DEVICE

RELATED APPLICATIONS

This application claims the priority of Japanese Patent Application No. 2001-365557 filed on Nov. 30, 2001, which is incorporated herein by reference. Further, this application is a divisional of U.S. patent application Ser. No. 10/496,667 filed on May 25, 2004, filed under 35 USC 371 of International Patent Application PCT/JP2002/11426 filed on Nov. 1, 2002. All applications are incorporated herein by reference.

TECHNICAL FIELD

This invention relates to a Zn-base semiconductor light emitting device and a method of fabricating the same, and in particular to a Zn-base semiconductor light emitting device adapted to blue to green visible wavelength band, and a method of fabricating the same.

BACKGROUND ART

It is generally believed as difficult to arbitrarily control conductivity type of II-VI compound semiconductors having Zn (zinc) as a Group II element in the periodic table (Zn-base semiconductor) due to self-compensation effect caused by formation of intrinsic defect. Under such circumference of Zn-base semiconductor, a recent effort has been succeeded in obtaining an n-type ZnTe (zinc telluride), having Te (tellurium) as a group VI element in the periodic table, and having a small band gap energy which belongs to green wavelength band, and in fabricating a light emitting device based on homo-junction using ZnTe.

The above-described light emitting device based on homo-junction using ZnTe, however, suffers from a suppressed emission efficiency, because ZnTe intrinsically has p-type conductivity in its non-doped state, has a lower carrier concentration in the n-type layer than in the p-type layer, and carriers can uniformly diffuse in the vicinity of a p-n junction interface to be formed.

One possible way to raise the emission efficiency is such as forming a double heterostructure in which an active layer is typically composed of ZnTe, and cladding layers are composed of a Zn-base semiconductor containing ZnTe. Formation of the double heterostructure is generally proceeded by vapor phase epitaxy such as the epitaxial growth process, but formation of the double heterostructure using a ZnTe wafer as a substrate, for example, may raise production costs higher than that in the formation of a p-n junction interface based on homo-junction using the ZnTe wafer.

While not being limited for the cases of ZnTe, it is important subjects for any light emitting devices having a light emitting region composed of a Zn-base semiconductor, of which conductivity type is believed to be less controllable, to raise the emission efficiency based on an effective carrier injection into the light emitting region, and to raise the luminance of light to be extracted.

This invention was conceived taking the above-described subjects into consideration. In other words, it is therefore an object of this invention to provide a Zn-base semiconductor light emitting device which is possibly raised in the emission efficiency in a light emitting region composed of Zn-base semiconductor, and to provide a method of fabricating the same.

DISCLOSURE OF THE INVENTION

A Zn-base semiconductor light emitting device of this invention aimed at solving the above-described Subjects is characterized in comprising a light-emitting region in which a p-n junction is formed by an interface between an n-type layer and a p-type layer; the n-type layer being a Zn-base semiconductor composed of Zn as a Group II element, and O or a combination of O and Te as Group VI element(s); and the p-type layer being a Zn-base semiconductor having a Te content larger than that of the n-type layer.

It is to be noted that the Zn-base semiconductor in this patent specification means an alloyed compound $ZnTe_{1-x}O_x$ ($0 \leq x \leq 1$) of ZnTe and ZnO, where ZnTe and ZnO (zinc oxide) also inclusive.

In the above-described Zn-base semiconductor in a non-doped state, ZnO (zinc oxide) shows a conductivity type of n-type, ZnTe (zinc telluride) shows p-type, alloyed compound $ZnTe_{1-x}O_x$ ($0 \leq x \leq 1$) of ZnTe and ZnO shows p-type for a ZnO alloy composition x of $0 \leq x < 0.5$, and n-type for a ZnO alloy composition x of $0.5 \leq x \leq 1$. In this invention, the p-type layer is configured using p-type $ZnTe_{1-x}O_x$ ($0 \leq x < 0.5$) (also simply referred to as p-type ZnTeO, hereinafter), and the n-type layer is configured using n-type $ZnTe_{1-x}O_x$ ($0.5 \leq x \leq 1$) (also simply referred to as n-type ZnTeO, hereinafter), and the light emitting region is formed by the p-n junction interface between the p-type layer and n-type layer.

By forming the light emitting region using the Zn-base semiconductor adjustable either to n-type and p-type under non-doped state, it is made possible to inject carriers into the light emitting region more effectively than in the conventional homo-junction-type light emitting device composed of a Zn-base semiconductor represented by ZnTe, and to thereby improve the emission efficiency.

Next, the p-type layer of the Zn-base semiconductor light emitting device of this invention is characterized in that it is composed of ZnTe. By configuring the p-type layer using ZnTe, it is made possible to adjust the emission obtainable from the light emitting region so as to have an emission wavelength equivalent to green, and to raise the emission efficiency as compared with the conventional homo-junction-type light emitting device composed of ZnTe.

In addition, it is still also possible to adjust the emission wavelength obtainable from the light emitting region, by adjusting the ZnO alloy composition x of the p-type ZnTeO composing the p-type layer. In an exemplary case where the p-type layer is composed of $ZnTe_{0.68}O_{0.32}$ (x=0.32), an emission wavelength equivalent to blue (approximately 500 nm) can be obtained from the light emitting region. As described in the above, it is made possible to obtain, from the light emitting region, light emission at a visible wavelength shorter than green, by configuring the p-type layer using p-type ZnTeO except ZnO.

A first aspect of a method of fabricating a Zn-base semiconductor light emitting device, the device having a p-n junction formed between an n-type layer which is a Zn-base semiconductor composed of Zn as a Group II element, and O or a combination of O and Te as Group VI element(s), and a p-type layer which is a Zn-base semiconductor having a Te content larger than that of the n-type layer, characterized in having a step of annealing a p-type ZnTe wafer in an oxidative atmosphere, to thereby form an n-type layer, which is a Zn-base semiconductor composed of Zn as a Group II element, and O or a combination of O and Te as Group VI element(s), and to consequently form a p-n junction therebetween.

By loading the p-type ZnTe wafer into an annealing furnace and annealing it under the oxidative atmosphere (thermal oxidation), Te sites in the main surficial side of the p-type ZnTe wafer is substituted by O (oxygen), and ZnO having a conductivity type of n-type are formed. In this process, the ZnO-base semiconductors composing the p-type layer and n-type layer at the p-n junction interface are determined by the number of Te sites substituted by O. Referring now to schematic drawings in FIGS. 4A to 4C, in an exemplary case where all of the Te sites on the n-type-layer side of the p-n junction interface are substituted by O, the p-n junction interface 3 is formed between the n-type ZnO layer 1 and a p-type ZnTe layer 2 (FIG. 4A). On the other hand, in the case where the Te sites on the n-type-layer side of the p-n junction interface are partially substituted by O, the p-n junction interface 3 is formed between an n-type ZnTeO layer 4 composed of n-type ZnTeO exclusive of ZnO, and the p-type ZnTe layer 2 (FIG. 4B). For the case where the Te sites are partially substituted by O, another possible case may be such that the n-type layer composing the p-n junction interface 3 will be the n-type ZnO layer 1 composed of ZnO, and the p-type layer will be a p-type ZnTeO layer 5 composed of p-type ZnTeO exclusive of ZnTe. The number of Te sites substituted by O, which determines the Zn-base semiconductors composing the p-type layer and n-type layer at the p-n junction interface is adjustable depending on temperature and process time of the thermal oxidation process.

By subjecting the p-type ZnTe wafer to the thermal oxidation process, it is made possible to readily form the p-n junction interface between the n-type ZnTeO layer composed of n-type $ZnTe_{1-x}O_x$ ($0.5 \leq x \leq 1$) and the p-type ZnTeO layer composed of p-type $ZnTe_{1-x}O_x$ ($0 \leq x < 0.5$). Because the carriers can be injected more efficiently into the n-type ZnTeO layer than into the p-type ZnTeO layer, it is made possible to improve the emission efficiency of visible light emission ranging over green to blue regions at the p-type ZnTeO layer in the vicinity of the p-n junction interface, as compared with that in a light emitting device based on homo-junction composed of a Zn-base semiconductor such as ZnTe.

A second aspect of a method of fabricating a Zn-base semiconductor light emitting device, the device having a p-n junction formed between an n-type layer which is a Zn-base semiconductor composed of Zn as a Group II element, and O or a combination of O and Te as Group VI element(s), and a p-type layer which is a Zn-base semiconductor having a Te content larger than that of the n-type layer, characterized in that the n-type layer is composed of ZnO, and in comprising a step of formation-by-stacking of the n-type layer on the main surface of the p-type ZnTe wafer.

As shown in FIG. 3A, by the formation-by-stacking of ZnO having an n-type conductivity on the main surface of the p-type ZnTe wafer, the p-n junction interface 3 can be formed at the interface between the p-type ZnTe layer 2 and an n-type ZnO layer 6. The p-n junction interface 3 formed by formation-by-stacking of the n-type ZnO layer 6 as described in the above is more successful in suppressing disturbance at the interface as compared with the p-n junction interface 3 shown in FIG. 4A, formed by the above-described thermal oxidation process. This is consequently successful in suppressing scattering of the carriers or generation of non-radiative center at the p-n junction interface 3 shown in FIG. 3A, and is further successful in improving emission efficiency in green light emission obtainable from the p-type ZnTe layer 2.

As a third aspect of a method of fabricating a Zn-base semiconductor light emitting device, other than the above-described second aspect, it is al so allowable to form the p-n junction interface 3 between the p-type ZnTeO layer 5 and n-type ZnO layer 6 as shown in FIG. 3B, by forming the p-type ZnTeO (exclusive of ZnTe) layer 5 by thermal oxidation of the surficial portion of the p-type ZnTe wafer, and then stacking thereon ZnO having an n-type conductivity. In this case, light emission in the visible wavelength band ranging from green to blue can be obtained by adjusting ZnO alloy composition of ZnTeO composing the p-type ZnTeO layer 5 depending on temperature and process time of the thermal oxidation process.

In the above-described second and third aspects of the method of fabricating a Zn-base semiconductor light emitting device of this invention, the formation-by-stacking of n-type ZnO can be proceeded by the vapor-phase epitaxy process or deposition process. The aforementioned formation-by-stacking of n-type ZnO also makes it possible to adjust the thickness of the n-type ZnO layer 6 more easily than in the method of the first aspect in which the n-type ZnO layer 1 is formed by the thermal oxidation process.

BEST MODES FOR CARRYING OUT THE INVENTION

The following paragraphs will describe best modes for carrying out this invention referring to the attached drawings.

Figure 2:
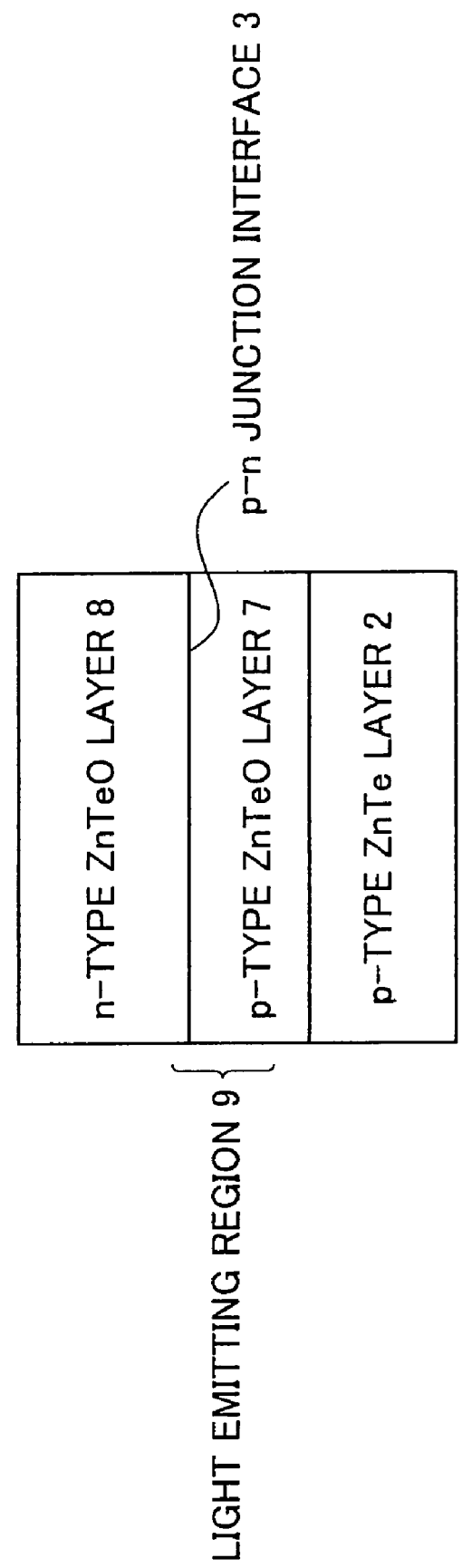
FIG. 2 is a schematic sectional view of an essential portion of the Zn-base semiconductor light emitting device showing one embodiment of this invention.

FIG. 2 is a schematic sectional view showing an essential portion of the Zn-base semiconductor light emitting device according to one embodiment of this invention. As described in the above, alloyed compound $ZnTe_{1-x}O_x$ ($0 \leq x \leq 1$) of ZnTe and ZnO will be p-type ZnTeO showing a p-type conductivity for a ZnO alloy composition x of $0 \leq x < 0.5$, and will be n-type ZnTeO showing an n-type conductivity for a ZnO alloy composition x of $0.5 \leq x \leq 1$. The p-n junction interface 3 shown in FIG. 2 is composed of a p-type ZnTeO layer 7 composed of p-type ZnTeO and an n-type ZnTeO layer 8 composed of n-type ZnTeO. The conventional light emitting device in which a homo-junction was configured using Zn-base semiconductor such as ZnTe was suffering from a problem in that an effective carrier injection was suppressed due to difficulty in controlling the conductivity type of the Zn-base semiconductor. On the contrary, because the n-type ZnTeO layer 8 and p-type ZnTeO layer 7 composing the p-n junction interface 3 shown in FIG. 2 are composed of Zn-base semiconductors showing n-type and p-type conductivities, respectively, in their non-doped state, it is made possible for the n-type ZnTeO layer 8 to effectively inject carriers into a light emitting region 9. This is consequently successful in raising the light emission efficiency at the light emitting region 9.

It is also made possible to allow the light emitting region 9 to emit a wide range of visible light over green to blue region through adjustment of the ZnO alloy composition of p-type ZnTeO composing the p-type ZnTeO layer 7.

The n-type ZnTeO layer 8 and/or p-type ZnTeO layer 7 shown in FIG. 2 can be formed by a fabrication method in which the main surficial side of the p-type ZnTe wafer is subjected to thermal oxidation. Process steps for the fabrication will be explained in the next.

The main surface of the p-type ZnTe wafer is cleaned by acetone solvent cleaning for removing organic matters, by rinsing with pure water, and by drying. Thereafter the p-type ZnTe wafer is loaded in a thermal oxidation furnace, annealed within a temperature range from 350° C. to 700° C. under an oxygen atmosphere so as to substitute the Te sites with O, to thereby form the n-type ZnTeO layer 8 and/or p-type ZnTeO layer 7 shown in FIG. 2.

Figure 4A:
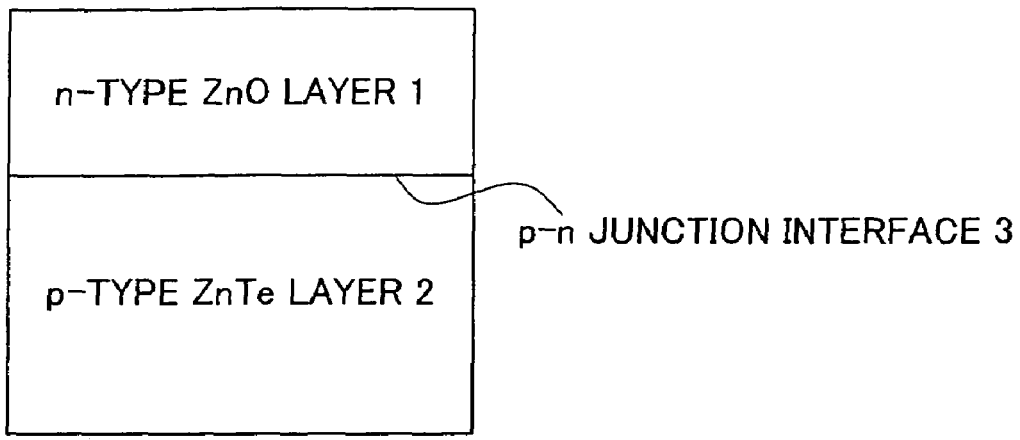
FIG. 4A is a first schematic drawing for explaining the Zn-base semiconductor light emitting device of this invention, formed by the thermal oxidation process.
Figure 4B:
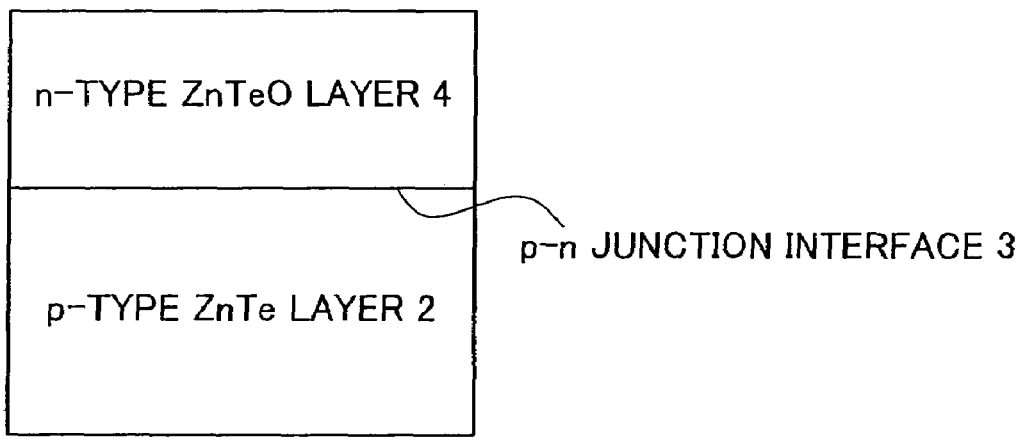
FIG. 4B is a second schematic drawing of the same.
Figure 4C:
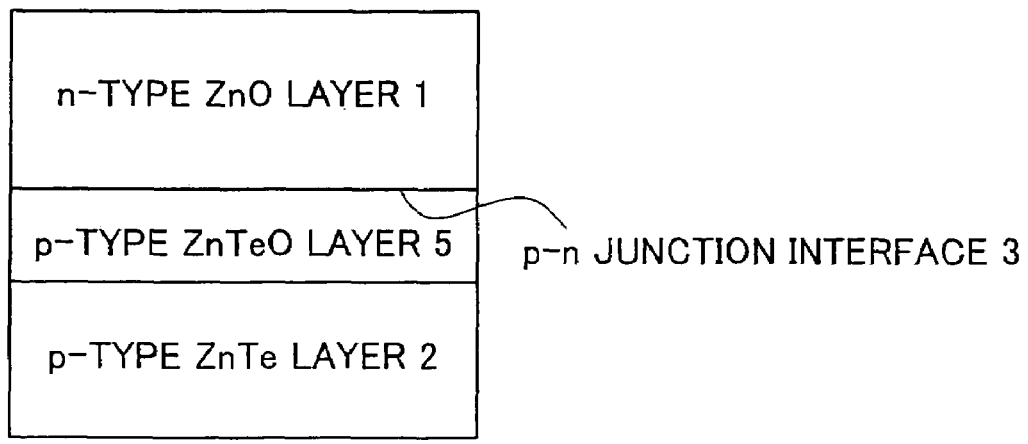
FIG. 4C is a third schematic drawing of the same.

The process temperature in the thermal oxidation process below 350° C. is undesirable because the thermal oxidation process for substituting the Te sites with O will not fully function, and on the other hand, the annealing temperature higher than 700° C. will be causative of dissipation of O once substituting the Te sites. The thermal oxidation is therefore preferably carried out within a temperature range from 350° C. to 700° C. Because the number of the Te sites substitutable with O increases as the process temperature of the thermal oxidation raises, adjustment of the process temperature within the above-described temperature range and of process time will be successful in properly determining the Zn-base semiconductor composing the p-type layer and/or n-type layer by which the p-n junction interface 3 is formed as shown in FIGS. 4A to 4C.

By forming the p-n junction interface 3 between the p-type layer and n-type layer composed of a Zn-base semiconductor by the fabrication method based on the thermal oxidation, the carriers can be injected more efficiently into the p-type ZnTeO layer 7 rather than into the n-type ZnTeO layer 8. This is successful in raising the emission efficiency of visible light emission ranging over green to blue regions at the light emitting region 9, as compared with that of the conventional light emitting device based on homo-junction composed of a Zn-base semiconductor.

It is also possible to form the n-type ZnTeO layer 8 shown in FIG. 2 by vapor-phase epitaxy or deposition of n-type ZnTeO. Formation of the n-type ZnTeO layer 8 by vapor-phase epitaxy or deposition of n-type ZnTeO is more successful in suppressing disturbance at the p-n junction interface 3 as compared with the case where the n-type ZnTeO layer 8 is formed by the above-described thermal oxidation process. This is consequently successful in suppressing scattering of the carriers or generation of non-luminescent center at the p-n junction interface 3, and is further successful in improving emission efficiency of light emission obtainable from the p-type ZnTeO layer 7. Another advantage of forming the n-type ZnTeO layer 8 by the vapor-phase epitaxy or deposition of n-type ZnTeO resides in that the thickness of the n-type ZnTeO layer 8 can more readily be controlled than in the fabrication method based on the above-described thermal oxidation process.

Figure 3A:
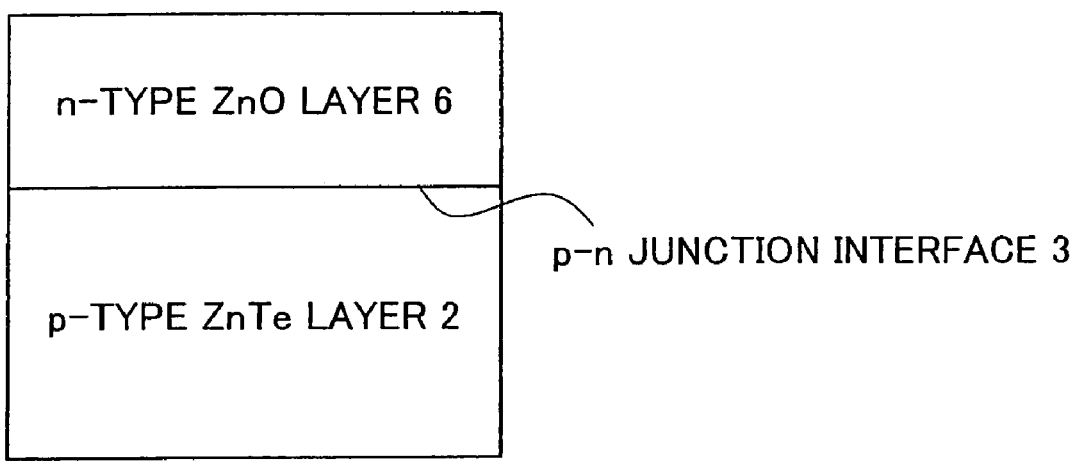
FIG. 3A is a first schematic drawing for explaining the Zn-base semiconductor light emitting device of this invention, formed by the vapor-phase epitaxy process or deposition process.
Figure 3B:
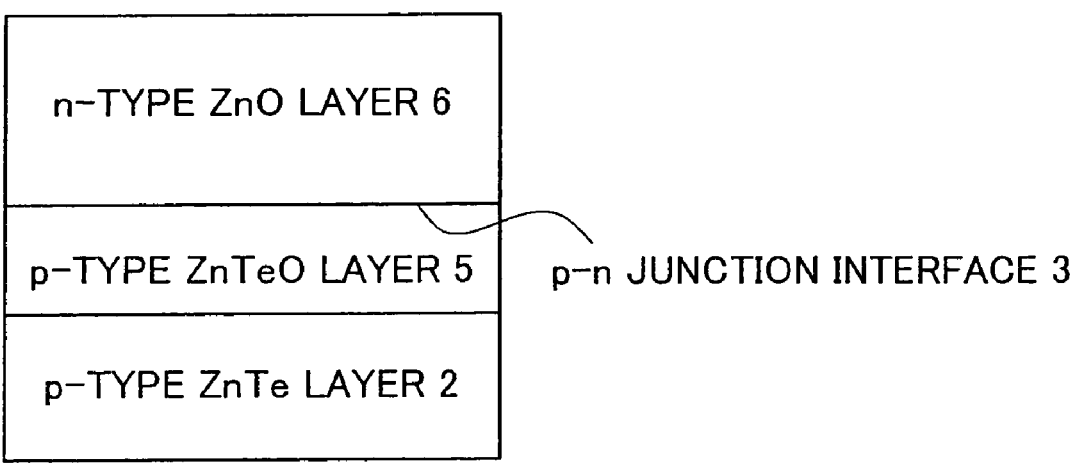
FIG. 3B is a second schematic drawing for explaining the same.

In the fabrication process for forming the n-type ZnTeO layer 8 based on vapor-phase epitaxy of n-type ZnTeO, the n-type ZnTeO layer 8 can be formed by cleaning the main surface of the p-type ZnTe wafer according to a process step similar to that in the fabrication method based on the above-described thermal oxidation process, by loading the p-type ZnTe wafer into a reaction furnace for vapor-phase epitaxy, and by stacking n-type ZnTeO on the main surface of the p-type ZnTe wafer. For the purpose of forming the p-n junction interface 3 using the Zn-base semiconductor as shown in FIG. 3B, it is also allowable to form, before formation of the n-type ZnTeO layer 8, the p-type ZnTeO layer (where, ZnTe exclusive) in the main surficial layer of the p-type ZnTe wafer by thermal oxidation of the main surficial side thereof, and then to form the n-type ZnTeO layer 8 on the main surface thereof.

The above-described, vapor-phase epitaxy of n-type ZnTeO can be carried out by vapor-phase epitaxy process such as MOVPE (Metal Organic Vapor Phase Epitaxy) process, or MBE (Molecular Beam Epitaxy) process. It is to be noted that MBE described in this patent specification not only means MBE in a narrow sense using both of the metal element component source and non-metal element component source in a solid state, but conceptually includes MOMBE (Metal Organic Molecular Beam Epitaxy) using the metal element component in a form of organic metal and using the non-metal element component source in a solid state; gas source MBE using the metal element component source in a solid state and the non-metal element component source in a gas state; and chemical beam epitaxy (CBE (Chemical Beam Epitaxy)) using the metal element component source in a form of organic metal and using the non-metal element component source in a gas form.

For the case where the MOVPE process is typically adopted as the aforementioned vapor-phase epitaxy process, major raw materials for n-type ZnTeO composing the n-type ZnTeO layer 8 shown in FIG. 2 include the followings:

Oxygen component source gas: preferably supplied in a form of an oxidative compound gas in view of suppressing excessive reaction with organo-metallic gases described later, although supply in a form of oxygen gas also allowable. Specific examples include $N_2O$, NO, $NO_2$ and CO. $N_2O$ (nitrous oxide) is used in this embodiment;

Te source gas: diethyl tellurium (DETe), etc.; and

Zn source (metal component source) gas: dimethyl zinc (DMZn), diethyl zinc (DEZn), etc.

The n-type ZnTeO layer 8 can be formed by the vapor-phase epitaxy of n-type ZnTeO using the above-described major source materials under a temperature atmosphere of 300° C. to 800° C. or around to a thickness of approximately 1 to 20 μm. For the purpose of relaxing lattice mismatching between the p-type ZnTeO for composing the p-type ZnTeO layer 7 and the n-type ZnTeO, it is also allowable in this process to form n-type ZnTeO by the vapor-phase epitaxy at a relatively low temperature ranging from 300° C. to 500° C. or around to a thickness of approximately 5 to 50 nm, which is smaller than the critical film thickness, and then to further form n-type ZnTeO by the vapor-phase epitaxy under a temperature atmosphere at a temperature elevated to as high as 400° C. to 800° C. or around, so as to form the n-type ZnTeO layer 8 to a thickness of approximately 1 to 20 μm. Adoption of this method is successful in improving the crystallinity of the n-type ZnTeO layer 8, consequently improving the n-type conductivity of the n-type ZnTeO layer 8, and in effectively injecting the carriers into the light emitting region 9.

Referring now to the thickness of the above-described n-type ZnTeO layer 8 formed by the vapor-phase epitaxy, a resultant thickness of smaller than 1 μm will fail in injecting a necessary number of carriers from the n-type ZnTeO layer 8 into the light emitting region 9. On the other hand, the thickness of the n-type ZnTeO layer 8 exceeding 20 μm will be expectant of effectively injecting the carriers from the n-type ZnTeO layer 8 into the light emitting region 9, and of enhancing the light extraction effect from the side faces of the light emitting device, but too excessive thickness will be causative of increase in the production cost. It is therefore preferable to suppress the thickness of the n-type ZnTeO layer 8 to as small as 20 μm or less. Because n-type ZnTeO composing the n-type ZnTeO layer 8 has a refractive index of as small as 2.0 or around, and can ensure a large critical angle of total reflection at the interface of the main surface of the n-type ZnTeO layer 8 and the air for the case where the light emission obtained from the light emitting region 9 is extracted mainly through the n-type ZnTeO layer. 8, it is possible to fully extract the light from the main surface of the n-type ZnTeO layer 8 even if the thickness thereof is adjusted to as small as 20 μm or below. Considering the above, the thickness of the n-type ZnTeO layer 8 is preferably adjusted to 1 μm to 20 μm, both ends inclusive.

In the formation of the n-type ZnTeO layer 8, it is also possible to dope n-type carriers by adding any one, or two or more species of Al, Ga and In as n-type dopant(s). Examples of the available dopants include the followings:

Al source gas: trimethyl aluminum (TMAl), triethyl aluminum (TEAl), etc.;

Ga source gas: trimethyl gallium (TMGa), triethyl gallium (TEGa), etc.; and

In source gas: trimethyl indium (TMIn), triethyl indium (TEIn), etc.

For the case where the n-type ZnTeO is deposited to form the n-type ZnTeO layer 8, the deposition may also be proceeded by other deposition process such as sputtering, besides the aforementioned vapor-phase epitaxy.

Figure 1:
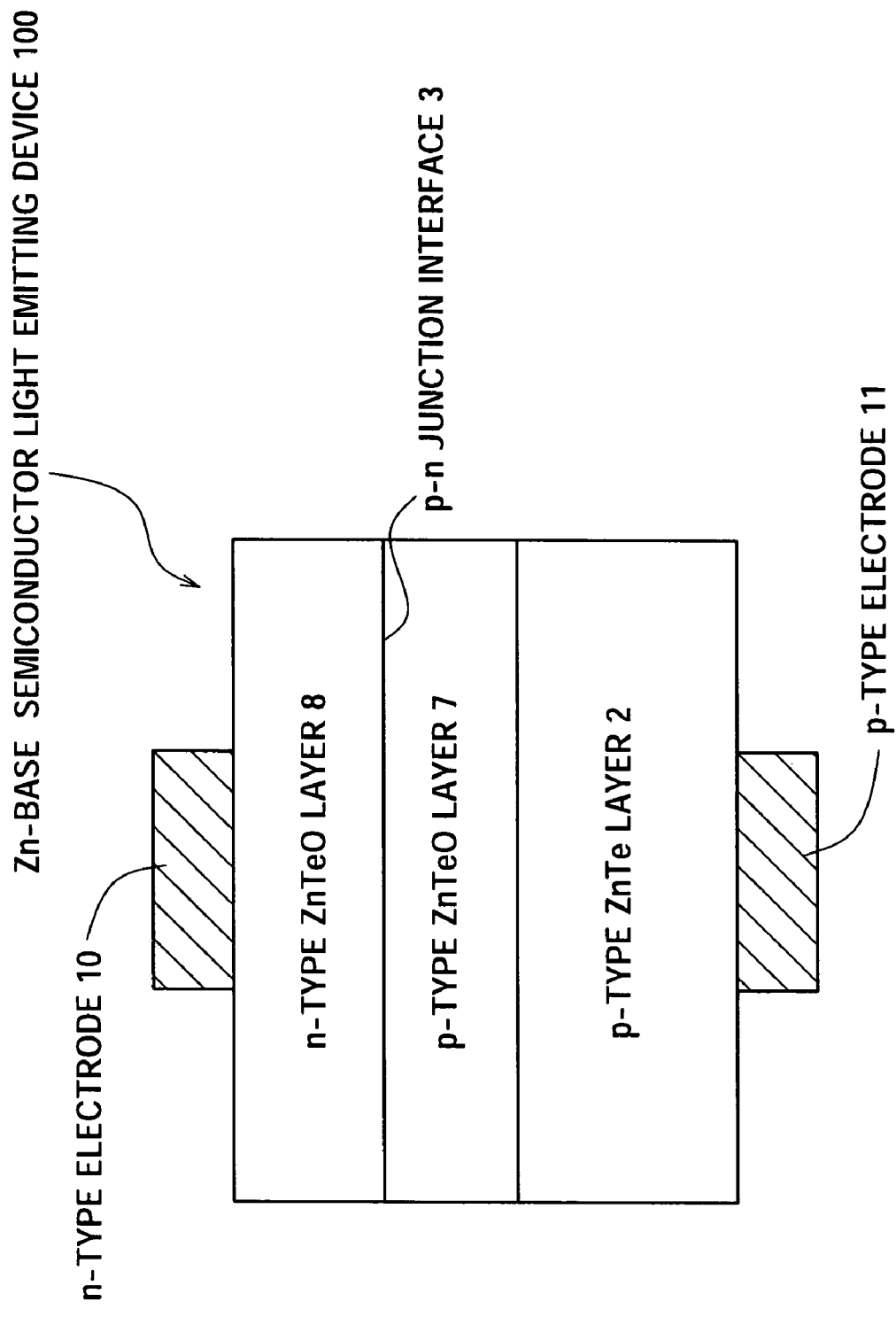
FIG. 1 is a schematic sectional view showing one embodiment of a Zn-base semiconductor light emitting device according to this invention.

After completion of the stacked structure shown in FIG. 2 according to the fabrication method described in the above, an n-type electrode 10 composed of Al and a p-type electrode 11 composed of In are formed as shown in FIG. 1 to thereby obtain a Zn-base semiconductor light emitting device 100 allowing light extraction from the n-type-electrode 10 side.

The invention claimed is:

1. A method of fabricating a Zn-base semiconductor light emitting device comprising a step of annealing a p-type ZnTe wafer in an oxidative atmosphere, to thereby form an n-type layer, which is a Zn-base semiconductor composed of Zn as a Group II element, and O or a combination of O and Te as Group VI element(s), and to consequently form a p-n junction therebetween.

2. The method of fabricating a Zn-base semiconductor light emitting device as claimed in claim 1, wherein the n-type layer is formed by a step of formation-by-stacking which is based on the vapor-phase epitaxy process or deposition process.

* * * * *